(12) United States Patent
Yang et al.

(10) Patent No.: US 7,821,860 B2
(45) Date of Patent: Oct. 26, 2010

(54) STABLE TEMPERATURE ADJUSTMENT FOR REFRESH CONTROL

(75) Inventors: Hiu-Kap Yang, Gyeonggi-do (KR); Myung-Gyoo Won, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 458 days.

(21) Appl. No.: 11/549,889

(22) Filed: Oct. 16, 2006

(65) Prior Publication Data

US 2007/0121408 A1 May 31, 2007

(30) Foreign Application Priority Data

Nov. 30, 2005 (KR) .............. 10-2005-0115887

(51) Int. Cl.
*G11C 11/406* (2006.01)
*G11C 7/04* (2006.01)
(52) U.S. Cl. .................... 365/211; 365/222
(58) Field of Classification Search ............ 365/193, 365/211, 222, 233.1, 233.11, 233.14
See application file for complete search history.

(56) References Cited

U.S. PATENT DOCUMENTS 5,495,452 A 2/1996 Cha 7,035,157 B2 * 4/2006 Chang ............... 365/222
2005/0052919 A1 * 3/2005 Chou ................ 365/222
2006/0023546 A1 * 2/2006 Park ................. 365/222
2006/0190210 A1 * 8/2006 Mukherjee .......... 702/130

FOREIGN PATENT DOCUMENTS

JP 2005-222574 8/2005
KR 10-0232749 9/1999

OTHER PUBLICATIONS

English language abstract for Korean Publication No. 10-0232749 in the form of Japanese Patent Application No. 07-092038.
English language abstract for Japanese Publication No. 2005-222574.

* cited by examiner

*Primary Examiner*—J. H. Hur
(74) *Attorney, Agent, or Firm*—Volentine & Whitt, PLLC

(57) ABSTRACT

A refresh control circuit and method generates a refresh signal in response to one of a plurality of clock signals and a temperature signal. The clock signals and temperature signal may be synchronized to prevent an incomplete refresh operation at a trip point of a temperature sensor. In one embodiment, a pulse generator may generate a temperature sensor enable signal in response to the clock signals when the clock signals are synchronized. In other embodiments, the temperature signal may be latched to prevent a transition in the refresh signal during a refresh operation. The temperature signal may be latched in response to one of the clock signals or the refresh signal.

13 Claims, 6 Drawing Sheets

STABLE TEMPERATURE ADJUSTMENT FOR REFRESH CONTROL

This application claims priority from Korean Patent Application No. 10-2005-0115887, filed on Nov. 30, 2005, in the Korean Intellectual Property Office, which is incorporated by reference.

BACKGROUND

1. Field of Invention

The inventive principles of this patent disclosure relate to a semiconductor memory device, and more particularly, to a circuit and method to provide stable refresh control at the trip point of a temperature sensor.

2. Description of the Related Art

Semiconductor devices have operational characteristics that vary with changes in temperature. Typical operational characteristics of semiconductor devices include current consumption and operating speed. As the temperature increases, the operating speed decreases. As the temperature decreases, current consumption increases.

These temperature characteristics are of great importance to volatile memory devices such as dynamic random access memories (DRAMs). Since DRAM cells experience increasing leakage current as temperature rises, data maintenance characteristics deteriorate due to charge loss, which reduces data maintenance time. Therefore, DRAMs require faster refresh operations at temperature increases.

Developments in electronic technologies have enabled portable electronic devices such as beepers, cellular phones, MP3 players, calculators, laptop computers, personal digital assistants (PDAs), etc., to be designed and manufactured cost-effectively. These portable electronic devices require direct current (DC) power which is supplied by at least one battery as an energy source.

It is most important that battery operated systems minimize power consumption. To this end, many devices have a sleep mode for saving power in which circuit components embedded in the battery operated systems are turned off. However, DRAMs embedded in battery operated systems must periodically refresh data stored in DRAM cells in order to continuously maintain the DRAM cell data.

The refresh period for a DRAM must be changed depending on temperature to reduce power consumption. For example, at lower temperatures where the current consumption increases, the refresh period is increased to reduce the relative number refresh operations so as to reduce the power consumption of the DRAM.

FIG. 1 is a block diagram of a conventional refresh control circuit 100. Referring to FIG. 1, the refresh control circuit 100 comprises a counter 110, a pulse generator 120, a temperature sensor 130, a refresh master block 140, and a wordline enable unit 150.

The counter 110 receives an oscillator clock signal (OSC) and generates a plurality of clock signals $Q_0, Q_1, Q_2, \ldots Q_n$. The counter 110 will now be in detail described with reference to FIG. 2.

FIG. 2 is a block diagram of the counter 110 illustrated in FIG. 1. Referring to FIG. 2, the counter 110 comprises a plurality of serially connected divider circuits 201, 202, 203, 204, and 205. The first divider circuit CNT0 divides the OSC and generates the first clock signal $Q_0$. The second divider circuit CNT1 divides the first clock signal $Q_0$ and generates the second clock signal $Q_1$. The third divider circuit CNT2 divides the second clock signal $Q_1$ and generates the third clock signal $Q_2$. The n+1$^{st}$ divider circuit CNTn divides the n$^{th}$ clock signal $Q_{n-1}$ and generates the n+1$^{st}$ clock signal $Q_n$. The n+1$^{st}$ clock signal $Q_n$ has the longest clock period.

FIG. 3 is a circuit diagram of the pulse generator 120 illustrated in FIG. 1. Referring to FIG. 3, the pulse generator 120 comprises a delay unit 310 that receives the n+1$^{st}$ clock signal $Q_n$ of the counter 110 and delays the n+1$^{st}$ clock signal $Q_n$, a NAND gate 320 that receives an output of the delay unit 310 and the n+1$^{st}$ clock signal $Q_n$, and first and second inverters 330 and 340 that receive an output of the NAND gate 320 and generates a temperature sensor enable signal PTENB. The first and second inverters 330 and 340 form a buffer. The temperature sensor enable signal PTENB is a pulse signal having a logic low section corresponding to a delayed time of the delay unit 310.

The temperature sensor 130 senses a present temperature of a DRAM chip in response to the temperature sensor enable signal PTENB. The temperature sensor 130 can have a plurality of trip points. For example, the temperature sensor 130 has two trip points and generates first and second temperature signals T45 and T85 according to the sensed temperature. The first temperature signal T45 is logic high when the sensed temperature is above 45° C., and is logic low when the sensed temperature is below 45° C. The second temperature signal T85 is logic high when the sensed temperature is above 85° C., and is logic low when the sensed temperature is below 85° C.

The refresh master block 140 selects one of the clock signals $Q_0, Q_1, Q_2, \ldots Q_n$ generated by the counter 110 in response to PTENB and the first and second temperature signals T45 and T85. The refresh master block 140 generates a refresh control signal SRFHP according to the selected clock signal, and generates a refresh signal PREF in response to the refresh control signal SRFHP. The wordline enable unit 150 enables wordlines (not shown) of memory cells in response to the refresh signal PREF.

The refresh control circuit 100 changes the frequency of refresh operations in response to the temperature of the surrounding DRAM chip based on the trip point of the temperature sensor 130. FIG. 4 illustrates a section of the temperature range in which erroneous refresh operations tend to occur. Referring to FIG. 4, an erroneous refresh operation section is around 45° C. An erroneous refresh operation will now be described in detail with reference to FIG. 5. FIG. 5 is a timing diagram of the operation of the reference period control circuit 100.

Referring to FIG. 5, a $Q_i$ clock signal, a $Q_j$ clock signal, and a $Q_n$ clock signal are shown among the clock signals $Q_0, Q_1, Q_2, \ldots Q_n$. The $Q_i$ clock signal is selected according to an initially sensed chip temperature. The refresh control signal SRFHP is generated according to the $Q_i$ clock signal (①). The refresh signal PREF having a logic high pulse is generated in response to a falling edge of the refresh control signal SRFHP (②).

The temperature sensor enable signal PTENB is logic low in response to a rising edge of the $Q_n$ clock signal having the longest clock period (③). The temperature sensor 130 is operated to sense a present temperature of the DRAM chip during a time when the temperature sensor enable signal PTENB is logic low.

When the temperature sensor enable signal PTENB changes from logic low to logic high (④), the temperature sensor 130 selects the $Q_j$ clock signal according to the changed temperature. At this time, when a logic level of the presently selected $Q_j$ clock signal is different from that of the previously selected $Q_i$ clock signal, the refresh control signal SRFHP has a logic low level according to the $Q_i$ clock signal (⑤), and has a logic high level according to the $Q_j$ clock signal (⑥), thereby causing a short logic low pulse. The refresh signal PREF having a short logic high pulse is generated in response to the refresh control signal SRFHP having the short logic low pulse (⑦).

The refresh signal PREF having the short logic high pulse cannot enable wordlines (not shown) and refresh the memory cells connected to the wordlines. Therefore, a refresh operation is not complete, which causes a failure in the wordlines.

SUMMARY

Some of the inventive principles of this patent disclosure relate to a refresh control circuit having logic to synchronize clock signals and a temperature signal to prevent a transition in a refresh signal during a refresh operation. An embodiment may include a counter to generate a plurality of clock signals in response to an oscillator clock signal; a pulse generator to generate a temperature sensor enable signal in response to the clock signals; a temperature sensor to sense a current temperature of a chip and generate a temperature signal in response to the temperature sensor enable signal; a refresh master block to select one of the clock signals in response to the temperature sensor enable signal and the temperature signal, and to generate a refresh signal in response to the selected clock signal; and logic to synchronize the clock signals and temperature signal to prevent a transition in the refresh signal during a refresh operation.

In one embodiment, the logic may be implemented in the pulse generator to generate the temperature sensor enable signal when the clock signals are synchronized. In another embodiment, the logic may be implemented as a latch circuit to latch and synchronize the temperature signal.

Some additional inventive principles of this patent disclosure relate to a refresh control circuit including: a counter to generate a plurality of clock signals in response to an oscillator clock signal; a pulse generator to generate a temperature sensor enable signal in response to the clock signals when the clock signals are synchronized; a temperature sensor to sense a current temperature of a chip and generate a temperature signal in response to the temperature sensor enable signal; and a refresh master block to select one of the clock signals in response to the temperature sensor enable signal and the temperature signal, and to generate a refresh signal in response to the selected clock signal.

The pulse generator may include: a synchronizer to synchronize the clock signals based on a clock signal having the longest period among the clock signals; and a logic unit to generate the temperature sensor enable signal in response to an output of the synchronizer. The synchronizer may include: an inverter to receive the clock signal having the longest period among the clock signals; and a plurality of NAND gates to receive an output of the inverter and at least two of the other clock signals. The logic unit may include: a NOR gate to receive outputs of the NAND gates; and an inverter to outputting the temperature sensor enable pulse in response to an output of the NOR gate.

Some additional inventive principles of this patent disclosure relate to a refresh control circuit including: a counter to generate a plurality of clock signals in response to an oscillator clock signal; a pulse generator to generate a temperature sensor enable signal having a pulse in response to one of the clock signals; a temperature sensor to sense a current temperature of a chip and generate a temperature signal in response to the temperature sensor enable signal; and a latch circuit to latch and synchronize the temperature signal; and a refresh master block to select one of the clock signals in response to the temperature sensor enable signal and the latched temperature signal, and to generate a refresh signal in response to the selected clock signal.

The latch circuit may latch and synchronize the temperature signal in response to one of the clock signals. The latch circuit may alternatively latch and synchronize the temperature signal in response to the refresh signal. The latch circuit may latch the temperature signal when the refresh signal is deactivated.

Some additional inventive principles of this patent disclosure relate to a refresh control method including: generating a plurality of clock signals in response to an oscillator clock signal; generating a temperature signal in response to a current temperature of a chip; generating a refresh signal in response to the plurality of clock signals and the temperature signal; and synchronizing the clock signals and the temperature signal to prevent a glitch that causes an incomplete refresh operation.

Synchronizing the clock signals and the temperature signal may include: synchronizing the clock signals to generate a temperature sensor enable signal based on a clock signal having the longest period among the clock signals; and generating the temperature signal in response to the temperature sensor enable signal. Synchronizing the clock signals and the temperature signal may include latching the temperature signal in response to one of the clock signals. Synchronizing the clock signals and the temperature signal may include latching the temperature signal in response to the refresh signal.

DETAILED DESCRIPTION

Figure 1:
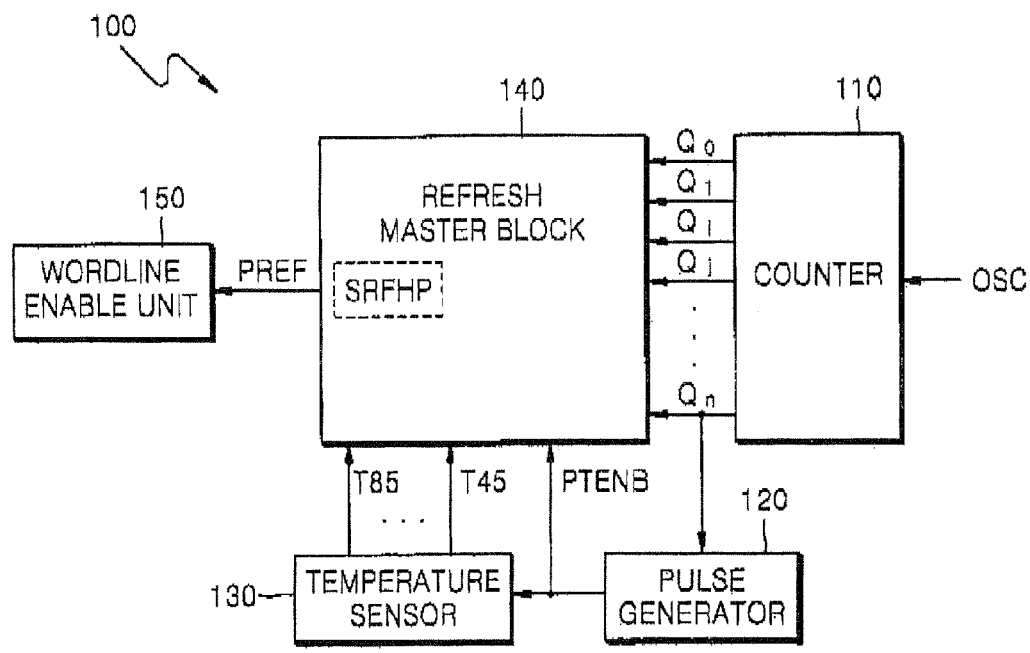
FIG. 1 is a block diagram of a conventional refresh control circuit.
Figure 2:
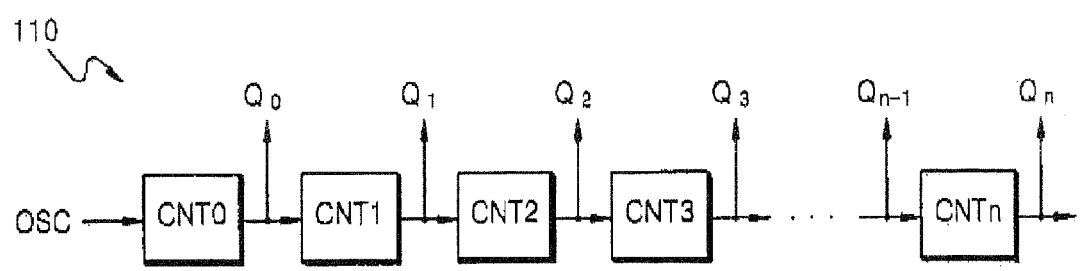
FIG. 2 is a block diagram of a counter illustrated in FIG. 1.
Figure 3:
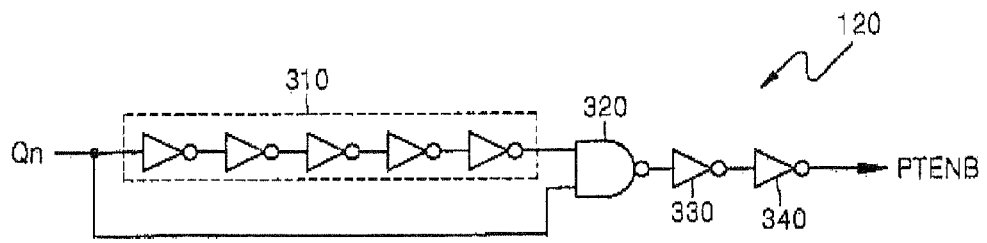
FIG. 3 is a circuit diagram of a pulse generator illustrated in FIG. 1.
Figure 4:
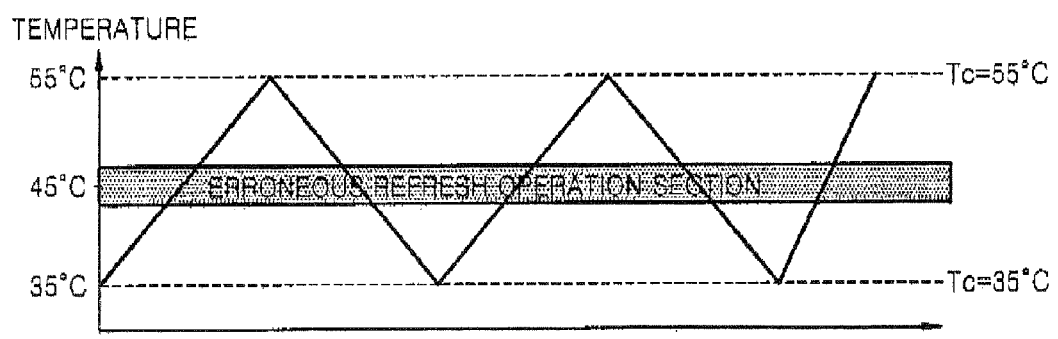
FIG. 4 illustrates section of a temperature range where an erroneous refresh operation occurs.
Figure 5:
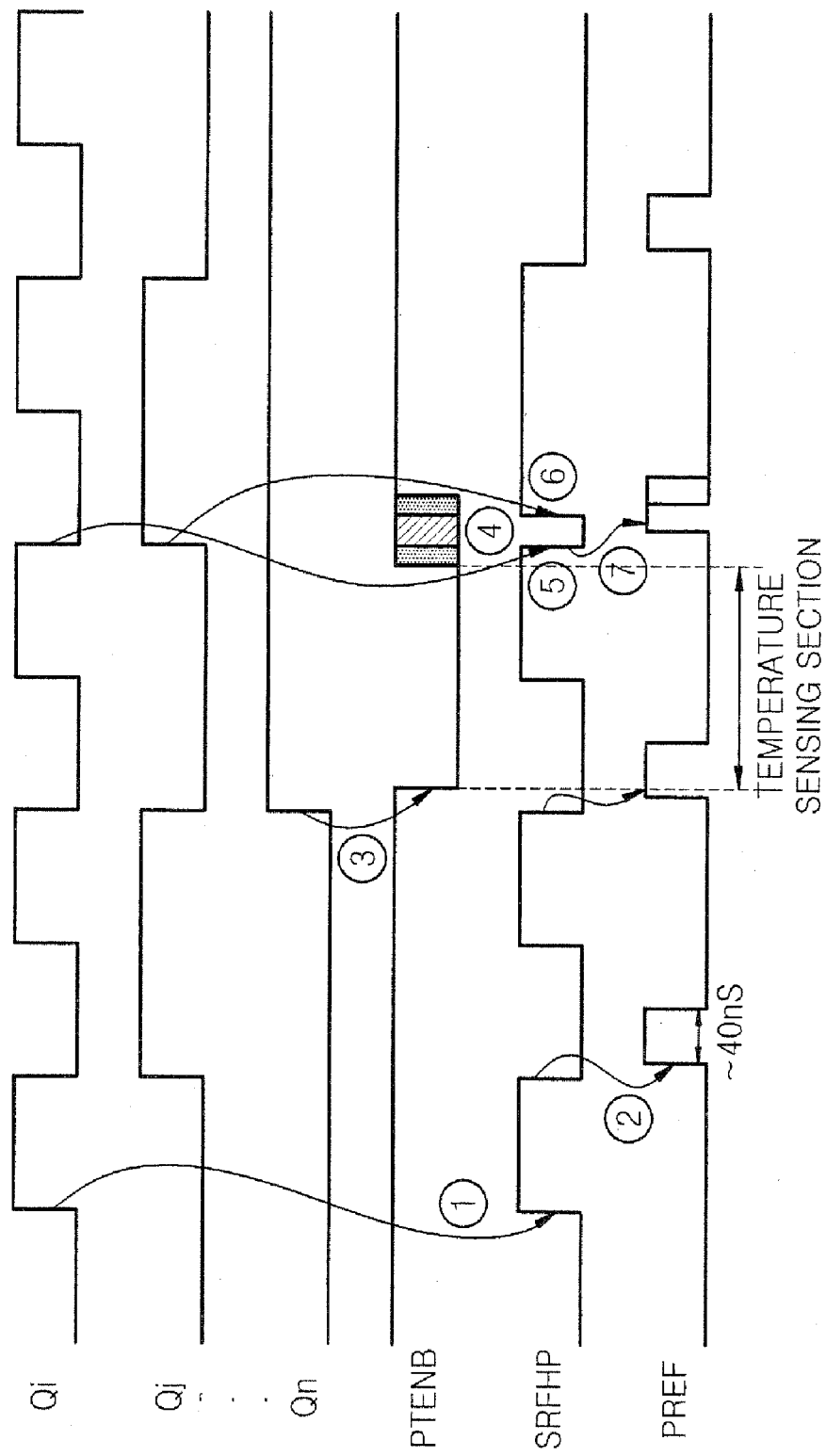
FIG. 5 is a timing diagram of the operation of a control circuit of FIG. 1.
Figure 6:
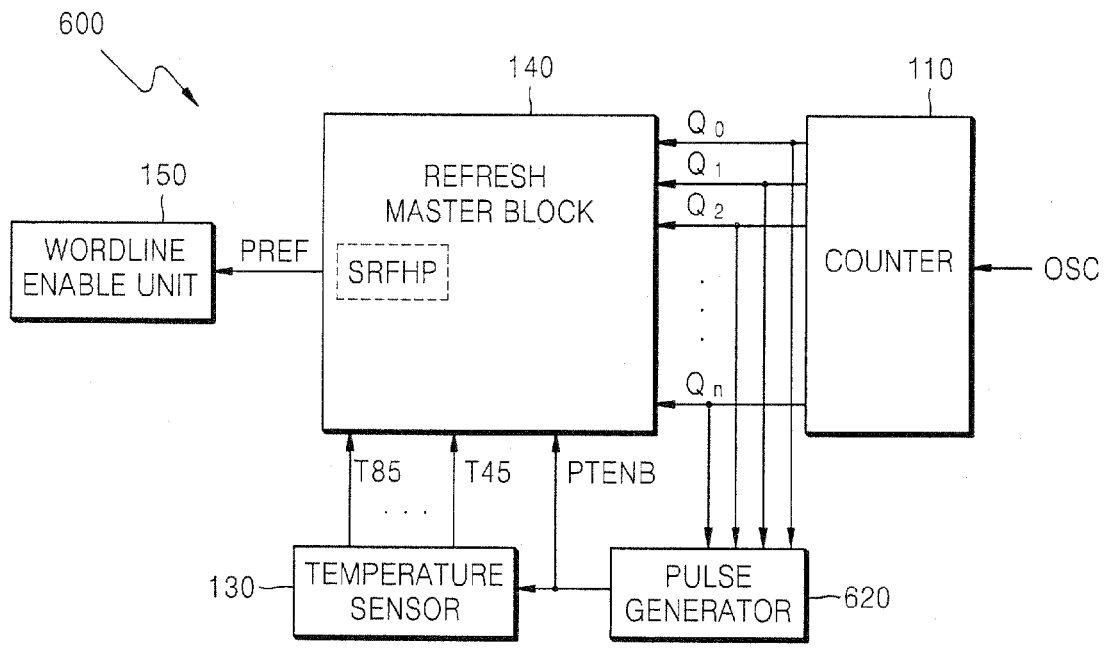
FIG. 6 is a block diagram of an embodiment of a refresh control circuit according to some of the inventive principles of this patent disclosure.

FIG. 6 is a block diagram of an embodiment of a refresh control circuit 600 according to some of the inventive principles of this patent disclosure. Referring to FIG. 6, the refresh control circuit 600 includes a counter 110, a pulse generator 620, a temperature sensor 130, a refresh master block 140, and a wordline enable unit 150. The refresh control circuit 600 is the same as the conventional refresh control circuit 100 illustrated in FIG. 1 except for the pulse generator 620. A description of the same constituents will be skipped.

Figure 7:
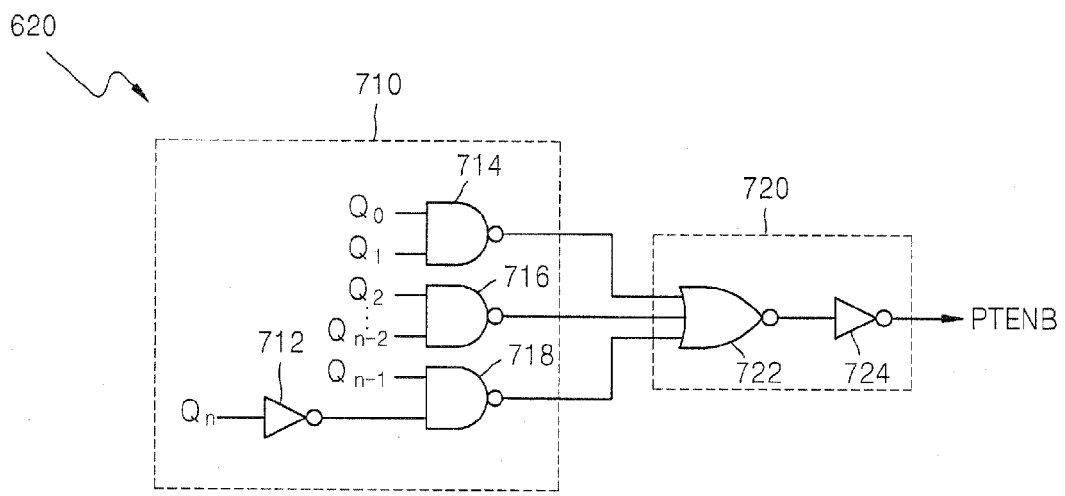
FIG. 7 is a circuit diagram of an embodiment of a pulse generator according to some of the inventive principles of this patent disclosure.

An embodiment of the pulse generator 620 will now be described with reference to FIG. 7. The pulse generator 620 includes a synchronizer 710 that receives the clock signals $Q_0, Q_1, Q_2, \ldots Q_n$ of the counter 110, and a logic unit 720 that generates the temperature sensor enable signal PTENB in response to outputs of the synchronizer 710.

The synchronizer 710 includes an inverter 712 that receives the $n+1^{st}$ clock signal $Q_n$, a first NAND gate 712 that receives the first clock signal $Q_0$ and the second clock signal $Q_1$, a second NAND gate 716 that receives the third clock signal $Q_2$ and the $n-1^{st}$ clock signals $Q_2, Q_{n-2}$, and a third NAND gate 718 that receives the $n^{th}$ clock signal $Q_{n-1}$, and an output of the inverter 712.

The logic unit 720 includes a NOR gate 722 that receives outputs of the first, second, and third NAND gates 714, 716, and 718 and an inverter 724 that receives an output of the NOR gate 722 and outputs the temperature sensor enable signal PTENB.

Figure 8:
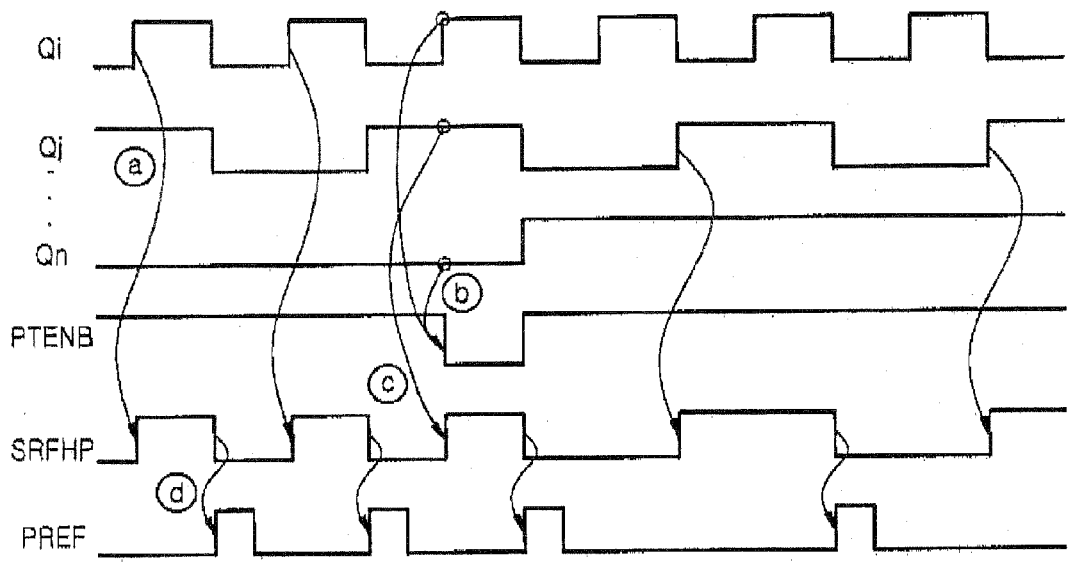
FIG. 8 is a timing diagram illustrating an embodiment of a refresh operation according to some of the inventive principles of this patent disclosure.

An operation of the pulse generator 620 will now be described with reference to FIG. 8. When the $n+1^{st}$ clock signal is logic low, if the first through $n^{th}$ clock signals $Q_0$ through $Q_{n-1}$ are logic high, the temperature sensor enable signal PTFNB is logic low. When the $n+1^{st}$ clock signal $Q_n$ is logic high or any one of the first through $n^{th}$ clock signals $Q_0$ through $Q_{n-1}$ is logic low, the temperature sensor enable signal PTENB is logic high.

The temperature sensor enable signal PTENB is provided to the temperature sensor 130 illustrated in FIG. 6 to sense the current temperature of the DRAM chip. The temperature sensor 130 senses the current temperature of the DRAM chip in response to the temperature sensor enable signal PTENB in a logic low state and generates the first and second temperature signals T45 and T85.

The refresh master block 140 illustrated in FIG. 6 selects one of the clock signals $Q_0, Q_1, Q_2, \ldots Q_{n-1}$ generated by the counter 110 in response to the temperature sensor enable signal PTENB in the logic low state and the first and second temperature signals T45 and T85. The refresh master block 140 generates the refresh control signal SRFHP according to the selected clock signals $Q_0, Q_1, Q_2, \ldots Q_{n-1}$. Since the selected clock signals $Q_0, Q_1, Q_2, \ldots Q_{n-1}$ are logic high, the logic level of the refresh control signal SRFHP does not change.

For example, the refresh master block 140 generates the refresh control signal SRFHP according to the $i^{th}$ clock signal $Q_i$ and an initially sensed chip temperature (ⓐ). The refresh master block 140 senses the chip temperature in response to the temperature sensor enable signal PTENB in the logic low state (ⓑ), and selects the $j^{th}$ clock signal $Q_j$ according to a change in the chip temperature. Since the $i^{th}$ clock signal $Q_i$ and the $j^{th}$ clock signal $Q_j$ have the same logic level (i.e., logic high), the refresh master block 140 generates the refresh control signal SRFHP according to the $j^{th}$ clock signal $Q_j$ without a glitch in the logic low level (ⓒ). The refresh master block 140 generates the refresh control signal SRFHP having a logic high pulse in response to the falling edge of the refresh control signal SRFHP (ⓓ).

Therefore, since the refresh control circuit 600 senses the chip temperature when the plurality of clock signals $Q_0, Q_1, Q_2, \ldots Q_{n-1}$ are synchronized and selects one of the clock signals $Q_0, Q_1, Q_2, \ldots Q_{n-1}$, the refresh master block 140 generates the refresh control signal SRFHP and the refresh signal PREF without a glitch and sufficiently refreshes the memory cells connected to the corresponding wordlines.

Figure 9:
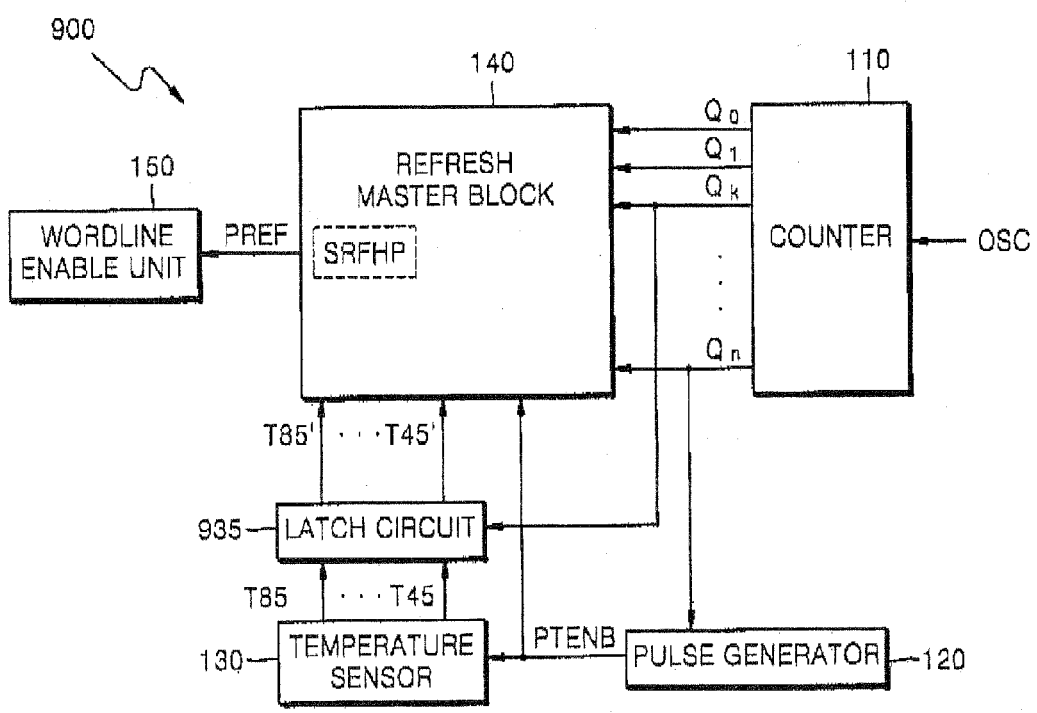
FIG. 9 is a block diagram of another embodiment of a refresh control circuit according to some of the inventive principles of this patent disclosure.

FIG. 9 is a block diagram of another embodiment of a refresh control circuit 900 according to some of the inventive principles of this patent disclosure. Referring to FIG. 9, the refresh control circuit 900 includes a counter 110, a latch circuit 935, a pulse generator 120, the temperature sensor 130, a refresh master block 140, and a wordline enable unit 150. The refresh control circuit 900 is the same as the conventional refresh control circuit 100 illustrated in FIG. 1 except for the latch circuit 935. A description of the same constituents will be skipped.

The latch circuit 935 synchronizes the first and second temperature signals T45 and T85 generated by the temperature sensor 130 in response to a $k^{th}$ clock signal $Q_k$ generated by the counter 110. The latch circuit 935 latches the first and second temperature signals T45 and T85 in response to the $k^{th}$ clock signal $Q_k$ and transfers the latched first and second temperature signals T45' and T85' to the refresh master block 140.

The refresh master block 140 selects one of the clock signals $Q_0, Q_1, Q_2, \ldots Q_{n-1}$ generated by the counter 110 in response to the latched first and second temperature signals T45' and T85' and the temperature sensor enable signal PTENB. Since the refresh master block 140 selects one of the clock signals $Q_0, Q_1, Q_2, \ldots Q_{n-1}$ using the first and second temperature signals T45' and T85' which are synchronized and latched to the $k^{th}$ clock signal $Q_k$, the refresh master block 140 generates the refresh control signal SRFHP according to the selected clock signals $Q_0, Q_1, Q_2, \ldots Q_{n-1}$ without a glitch.

Figure 10:
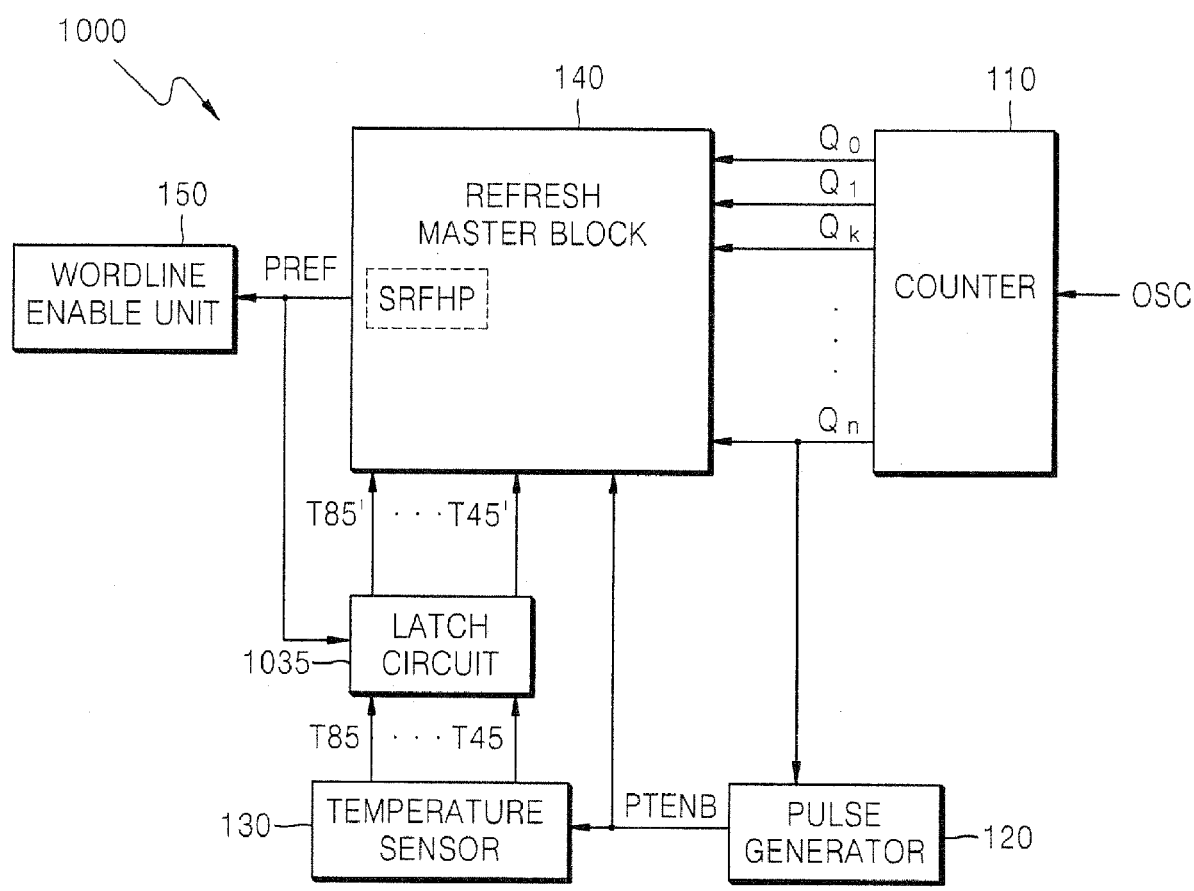
FIG. 10 is a block diagram of another embodiment of a refresh control circuit according to some of the inventive principles of this patent disclosure.

FIG. 10 is a block diagram of another embodiment of a refresh control circuit according to some of the inventive principles of this patent disclosure. Referring to FIG. 10, the refresh control circuit 1000 includes the counter 110, a latch circuit 1035, a pulse generator 120, a temperature sensor 130, a refresh master block 140, and a wordline enable unit 150. In comparison with the refresh control circuit 900 illustrated in FIG. 9, the latch circuit 1035 synchronizes the first and second temperature signals T45 and T85 generated by the temperature sensor 130 in response to the refresh signal PREF. The latch circuit 1035 latches the first and second temperature signals T45 and T85 in response to an inactivation of the refresh signal PREF and transfers the latched first and second temperature signals T45' and T85' to the refresh master block 140.

The refresh master block 140 does not receive the first and second temperature signals T45 and T85 generated by the temperature sensor 13 during a refresh operation according to an activation of the refresh control PREF. Therefore, the refresh master block 140 is not affected by a change in the temperature sensed by the temperature sensor 130 but stably generates the refresh control signal SRFHP.

In the embodiment of FIG. 10, although the temperature signals are described as being latched in response to PREF, they may also be described as being latched in response to one of the clock signals, since the refresh signal PREF is based on SRFHP which is essentially a selected one of the clock signals. Thus, the temperature signal latching operation is synchronized to the clock signals, and transitions in the refresh signal PREF are synchronized to the clock signals to prevent transitions that interfere with a refresh operation.

While the inventive principles of this patent disclosure have been particularly shown and described with reference to exemplary embodiments thereof, it will be understood by those of ordinary skill in the art that various changes in form and details may be made therein without departing from the scope of the inventive principles as defined by the following claims.

The invention claimed is:

1. A refresh control circuit comprising:
   a counter which generates a plurality of clock signals in response to an oscillator clock signal, the clock signals transitioning between first and second states at respectively different clock periods;

a pulse generator which generates a temperature sensor enable signal in response to the clock signals, wherein the temperature sensor enable signal is in an active state when a clock signal having the longest period among the clock signals is in the first logic state and the rest of the clock signals are in the second logic state, and the temperature sensor enable signal is in an inactive state when the clock signal having the longest period among the clock signals is in the second logic state and when any of the rest of the clock signals is in the first logic state;

a temperature sensor which is enabled to sense a current temperature of a chip and to generate a temperature signal when the temperature sensor enable signal is active, and which is disabled when the temperature sensor enable signal is inactive; and a refresh master block which selects one of the clock signals in response to the temperature sensor enable signal and the temperature signal, and which generates a refresh signal in response to the selected clock signal.

2. The refresh control circuit of claim 1, wherein the pulse generator comprises:
    a synchronizer to synchronize the clock signals based on the clock signal having the longest period among the clock signals; and
    a logic unit to generate the temperature sensor enable signal in response to an output of the synchronizer.

3. The refresh control circuit of claim 2, wherein the synchronizer comprises:
    an inverter to receive the clock signal having the longest period among the clock signals; and
    a plurality of NAND gates to receive an output of the inverter and at least two of the rest of the clock signals.

4. The refresh control circuit of claim 3, wherein the logic unit comprises:
    a NOR gate to receive outputs of the NAND gates; and
    an inverter for outputting the temperature sensor enable signal in response to an output of the NOR gate.

5. The refresh control circuit of claim 1, wherein the temperature sensor includes a plurality of temperature trip points and generates the temperature signal corresponding to the temperature trip points according to the sensed temperature of the chip.

6. The refresh control circuit of claim 1, wherein the first logic state comprises a logic low and the second logic state comprises a logic high.

7. A refresh control circuit, comprising:
    a counter which generates a plurality of clock signals in response to an oscillator clock signal, the clock signals transitioning between first and second states at respectively different clock periods;
    a pulse generator which generates a temperature sensor enable signal in response to the clock signals, wherein the temperature sensor enable signal is in an active state when a clock signal having the longest period among the clock signals is in the first logic state and the rest of the clock signals are in the second logic state, and the temperature sensor enable signal is in an inactive state when the clock signal having the longest period among the clock signals is in the second logic state and when any of the rest of the clock signals is in the first logic state;
    a temperature sensor which is enabled to sense a current temperature of a chip and to generate a temperature signal when the temperature sensor enable signal is active, and which is disabled when the temperature sensor enable signal is inactive;
    a refresh master block which selects one of the clock signals in response to the temperature sensor enable signal and the temperature signal, and which generates a refresh signal in response to the selected clock signal; and
    a logic circuit which synchronizes transitions in the refresh signal to the clock signals to prevent transitions that interfere with a refresh operation.

8. The refresh control circuit of claim 7, wherein the logic circuit is located in the pulse generator.

9. The refresh control circuit of claim 7, wherein the logic circuit comprises a latch circuit to latch and synchronize the temperature signal.

10. The refresh control circuit of claim 7, wherein the first logic state comprises a logic low and the second logic state comprises a logic high.

11. A refresh control method comprising:
    generating a plurality of clock signals in response to an oscillator clock signal, the clock signals transitioning between first and second states at respectively different clock periods;
    generating a temperature signal corresponding to a current temperature of a chip when a temperature sensor enable signal is in an active state;
    generating a refresh signal in response to the plurality of clock signals and the temperature signal; and
    synchronizing transitions in the refresh signal to prevent a glitch in the refresh signal;
    wherein synchronizing transitions in the refresh signal comprises:
        synchronizing the clock signals to generate the temperature sensor enable signal based on a clock signal having the longest period among the clock signals, wherein the temperature sensor enable signal is in the active state when the clock signal having the longest period among the clock signals is in the first logic state and the rest of the clock signals are in the second logic state, and the temperature sensor enable signal is in a non-active state when the clock signal having the longest period among the clock signals is in the second logic state and when any of the rest of the clock signals is in the first logic state.

12. The method of claim 11, further comprising generating a plurality of temperature signals corresponding to a plurality of temperature trip points according to the sensed temperature of the chip.

13. The method of claim 11, wherein the first logic state comprises a logic low and the second logic state comprises a logic high.

* * * * *